(12) United States Patent
Chen et al.

(10) Patent No.: US 10,175,272 B2
(45) Date of Patent: Jan. 8, 2019

(54) REMOTE DIFFERENTIAL VOLTAGE SENSING

(71) Applicant: Intersil Americas LLC, Milpitas, CA (US)

(72) Inventors: Wei Chen, Saratoga, CA (US); Xin Zhang, San Jose, CA (US); Gwilym Luff, Cambridge (GB); Peter J. Mole, St. Albans (GB)

(73) Assignee: INTERSIL AMERICAS LLC, Milpitas, CA (US)

( * ) Notice: Subject to any disclaimer, the term of this patent is extended or adjusted under 35 U.S.C. 154(b) by 470 days.

(21) Appl. No.: 14/692,979

(22) Filed: Apr. 22, 2015

(65) Prior Publication Data

US 2016/0061866 A1    Mar. 3, 2016

Related U.S. Application Data

(60) Provisional application No. 62/042,104, filed on Aug. 26, 2014.

(51) Int. Cl.
*G05F 1/30* (2006.01)
*G01R 19/10* (2006.01)
*G05F 1/56* (2006.01)

(52) U.S. Cl.
CPC .............. *G01R 19/10* (2013.01); *G05F 1/56* (2013.01)

(58) Field of Classification Search
CPC ...................................................... G05F 1/56
USPC .................. 323/265, 280–289, 315
See application file for complete search history.

(56) References Cited

U.S. PATENT DOCUMENTS

| | | | | |
|---|---|---|---|---|
| 4,004,242 A * | 1/1977 | Wheatley, Jr. | ........... | H03F 1/083 327/324 |
| 4,360,785 A * | 11/1982 | Schade, Jr. | ........... | H03F 3/4508 330/253 |
| 5,696,459 A * | 12/1997 | Neugebauer | ............ | H03F 3/005 323/315 |
| 5,909,137 A | 6/1999 | Kimura | | |
| 6,831,489 B2 * | 12/2004 | Cheung | ............ | H03K 3/356139 327/115 |
| 7,345,465 B2 | 3/2008 | Dequina et al. | | |
| 7,358,799 B2 * | 4/2008 | Schrodinger | ........... | H03F 1/223 327/552 |

(Continued)

*Primary Examiner* — Adolf Berhane
*Assistant Examiner* — Nusrat Quddus
(74) *Attorney, Agent, or Firm* — Foley & Lardner LLP

(57) ABSTRACT

A remote differential voltage sensing circuit having a voltage input (Vin) and a voltage output (Vout), comprises a dual differential input stage including a common-source or common-collector differential input stage in parallel with a common-gate or common-base differential input stage. The common-source or collector differential input stage has differential inputs, one coupled to the voltage input (Vin) and the other coupled to the voltage output (Vout). The common-gate or common-base differential input stage has differential inputs, one coupled to a local ground (Agnd) and the other coupled to a remote ground (Rgnd). An output stage is driven by an output of the dual differential input stage and produces an output voltage at the voltage output (Vout). A compensation network is coupled between the voltage output (Vout) and the output of the dual differential input stage.

25 Claims, 13 Drawing Sheets

(56) References Cited

U.S. PATENT DOCUMENTS

| | | | |
|---|---|---|---|
| 7,514,966 B2* | 4/2009 | Ho | H03K 5/2481 |
| | | | 327/53 |
| 8,120,424 B2 | 2/2012 | Luff | |
| 8,952,675 B2* | 2/2015 | Fort | G05F 1/625 |
| | | | 323/313 |
| 2005/0122170 A1* | 6/2005 | Kirby | H03F 1/3211 |
| | | | 330/253 |
| 2007/0188238 A1* | 8/2007 | Su | H03F 1/26 |
| | | | 330/301 |
| 2012/0293149 A1* | 11/2012 | Fort | G05F 1/625 |
| | | | 323/282 |

* cited by examiner

REMOTE DIFFERENTIAL VOLTAGE SENSING

PRIORITY CLAIM

The present application claims priority to U.S. Provisional Patent Application No. 62/042,104, filed Aug. 26, 2014, which is incorporated herein by reference.

BACKGROUND

Electrical systems, which can also be referred to as electrical apparatuses, often include both a silicon ground and a remote ground. The silicon ground (which can also be referred to as a local ground, an analog ground, or Agnd) is the ground associated with a die or chip. The remote ground (which can also be referred to as Rgnd, a return ground, or Rrtn) is the ground associated with a printed circuit board (PCB) to which the die or chip is attached.

To improve the accuracy of such systems, remote differential voltage sensing circuits (sometimes alternatively referred to as differential remote voltage sensing circuits) are often used. FIG. 1 illustrates a convention remote differential voltage sensing circuit 102 which includes two amplifiers, AMP1 and AMP2, and two resistor dividers to achieve remote sensing. One of the resistor dividers includes resistors R0 and R1, and the other one of the resistor dividers includes resistors R2 and R3. The two inputs to the remote differential voltage sensing circuit 102 in FIG. 1 are Vin and Rgnd, and the output of the remote differential voltage sensing circuit 102 is Vout, where Vout=Vin+Rgnd−Agnd. The conventional remote differential voltage sensing circuit 102 of FIG. 1 essentially functions as an analog calculation circuit.

Disadvantages associated with the conventional remote differential voltage sensing circuit 102 of FIG. 1 are that it takes up more silicon area than is desirable, it consumes more power than is desirable (because it includes two amplifiers), and it has a voltage offset (VOS) error that is greater than is desirable. More specifically, VOS=VOS1+2*VOS2, where VOS1 is the voltage offset error associated with the first amplifier (AMP1), VOS2 is the voltage offset error associated with the second amplifier (AMP2), and VOS is the total voltage offset error caused by the remote differential voltage sensing circuit 102 of FIG. 1.

To reduce power consumption, reduce silicon area, and reduce the voltage offset error, parallel transconductance (Gm) stages can be used to differentially sense a remote signal. An example of such a topology is illustrated in FIG. 2. More specifically, FIG. 2 illustrates a remote differential voltage sensing circuit 202 where the three inputs to the remote differential voltage sensing circuit 202 are Vin, Rgnd and Agrnd, and the output of the remote differential voltage sensing circuit 202 is Vout, where Vout=Vin+Rgnd−Agnd. Disadvantages associated with the remote differential voltage sensing circuit 202 of FIG. 2 are that it requires very good matching between the two input pairs, there is a common mode range limitation due to grounds as inputs, it still consumes more power than is desirable, and it still has a voltage offset (VOS) error that is greater than is desirable.

DETAILED DESCRIPTION

Figure 1:
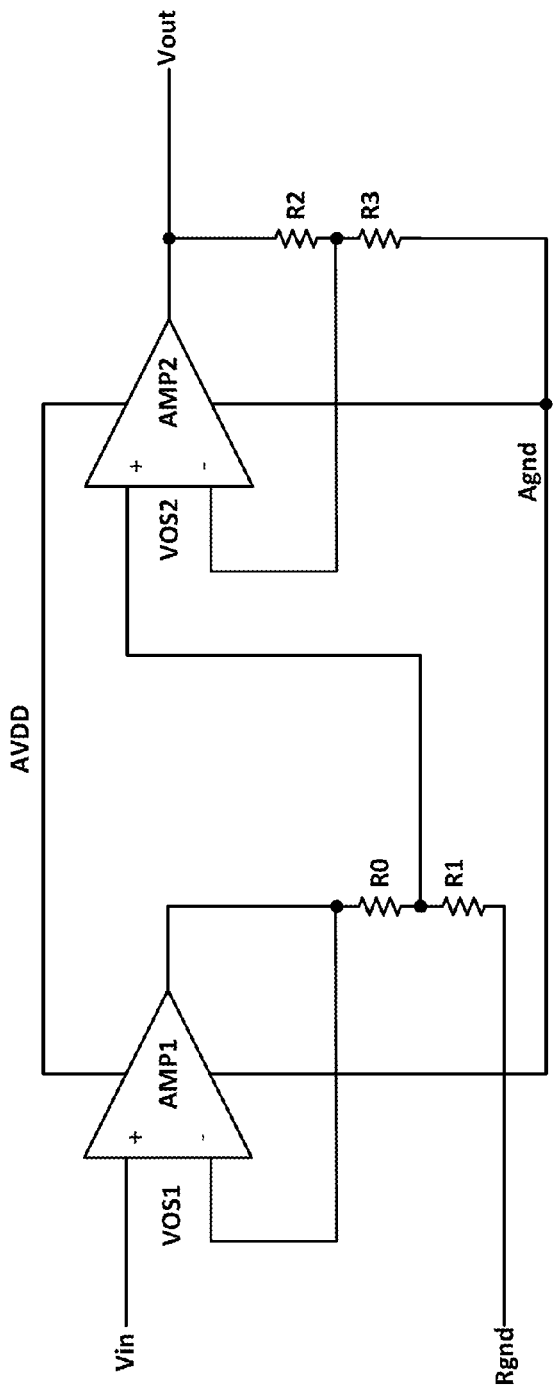
FIG. 1 illustrates a convention remote differential voltage sensing circuit.
Figure 2:
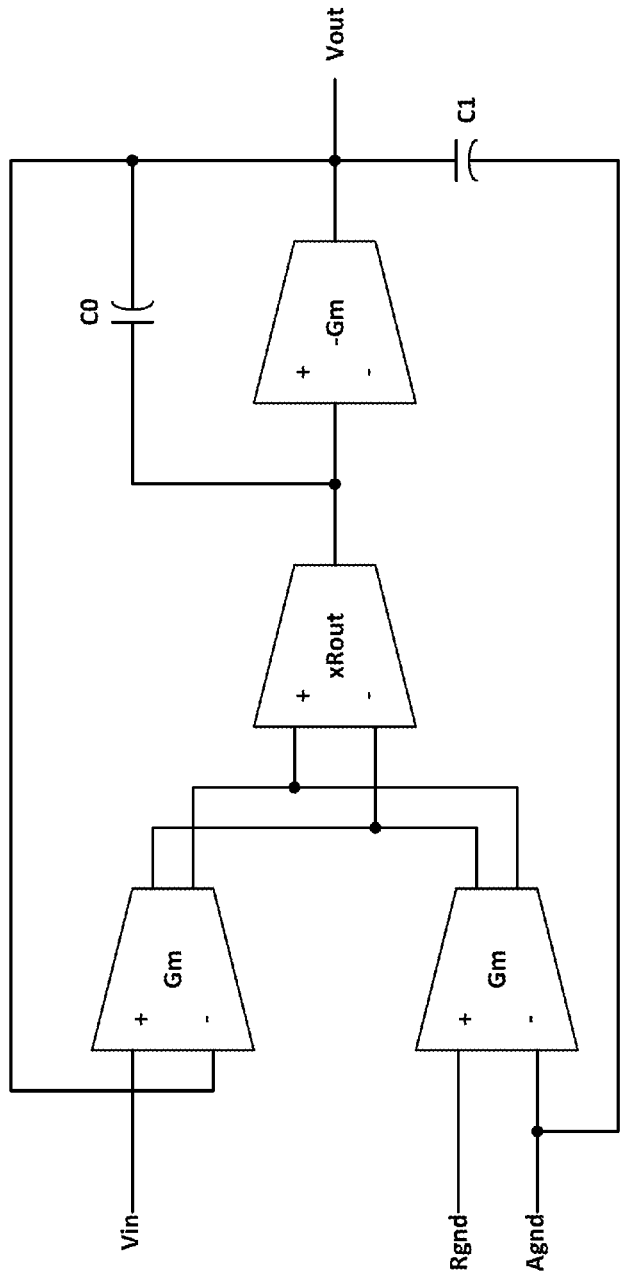
FIG. 2 illustrates an alternative embodiment of a remote differential voltage sensing circuit.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Figure 3A:
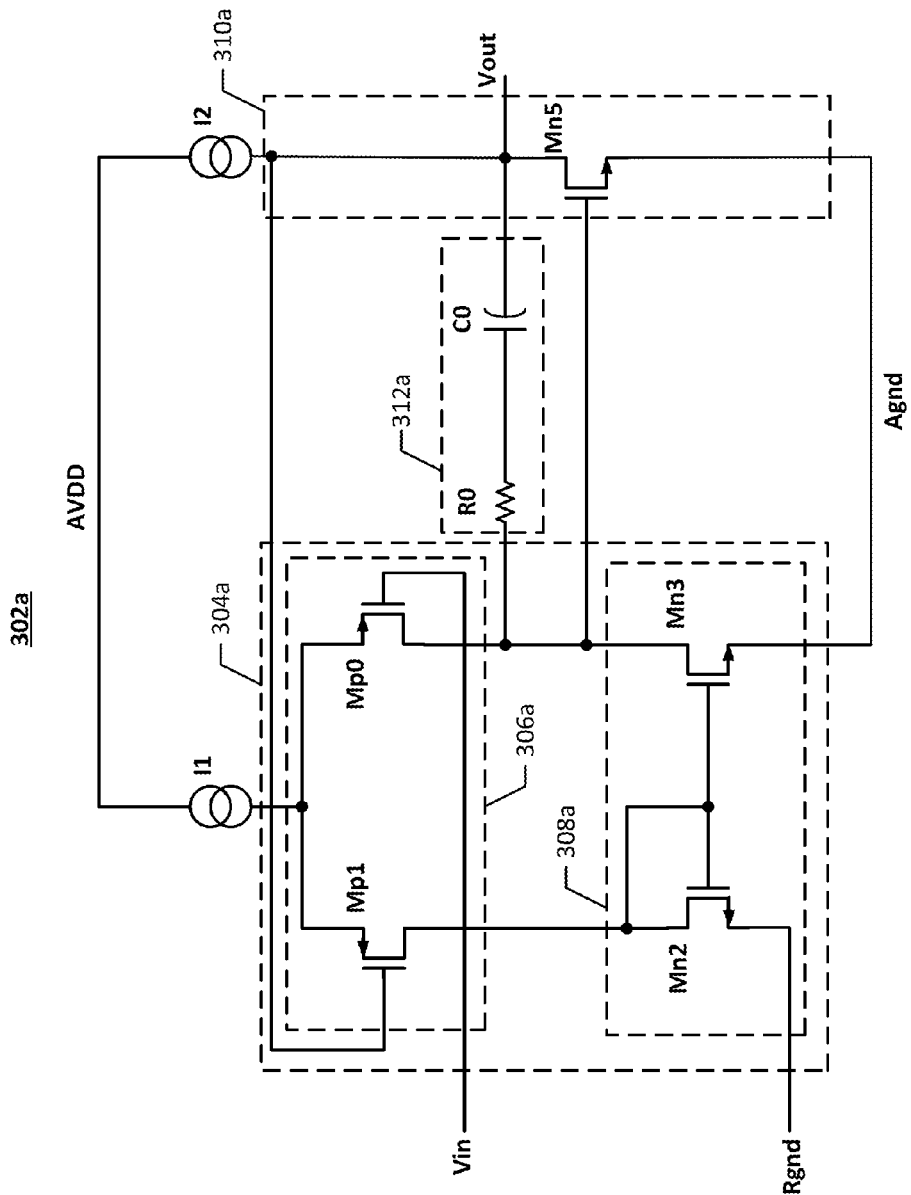
FIG. 3A illustrates a remote differential voltage sensing circuit according to an embodiment of the present invention.

FIG. 3A illustrates a remote differential voltage sensing circuit 302a according to an embodiment of the present invention. As can be appreciated from FIG. 3A, the embodiment shown therein can be implemented using as few as five metal-oxide-semiconductor field-effect transistors (MOSFETs) Mp0, Mp1, Mn2, Mn3 and Mn5 and one capacitor C0. Advantageously, the small geometry devices (i.e., the MOSFETs) are easily biased in their sub-threshold region and have a transconductance (Gm) similar to bipolar junction transistors. The sub-threshold design is implemented in the differential input stage with matching transconductances (Gms) between the PMOS pair Mp0 and Mp1 and the NMOS pair Mn3 and Mn2, as shown in FIG. 3A.

In the embodiment of FIG. 3A, the NMOS transistor Mn5 functions as an output stage 310a for the remote differential voltage sensing circuit 302a. The current sources I1 and I2 shown therein are used to bias the remote differential voltage sensing circuit 302a. The resistor R0 and the capacitor C0 provide a compensation network 312a to stabilize the two stage amplifier of the remote differential voltage sensing circuit 302a. In an embodiment, the resistor R0 can be implemented by a MOSFET device that functions as a resistor. The resistor R0 (or equivalent) reduces the effect of feed-forward through the compensation capacitor C0, improving the small signal stability of the circuit. The resistor R0 works with the capacitor C0 and 1/Gm5 to move the right hand plane (RHP) zero to the left hand plane (LHP) zero. It is also possible that the resistor R0 be eliminated from the compensation network 312a. In other words, the resistor R0 is optional.

In the embodiment of FIG. 3A, the transistors Mp0, Mp1, Mn3 and Mn2 form a dual differential input stage 304a that includes a common-source differential input stage 306a in parallel with a common-gate differential input stage 308a. The common-source differential input stage 306a has differential inputs, one of which is coupled to the voltage input (Vin), and the other one of which is coupled to the voltage output (Vout). The common-gate differential input stage 308a has differential inputs one of which is coupled to a local ground (Agnd) and the other one of which is coupled to a remote ground (Rgnd). An output of the dual differential input stage 304a is produced at or provided by the connected together drains of the transistors Mp0 and Mn3. In the embodiment of FIG. 3A, the transistor Mn5 provides an output stage 310a that is driven by an output of the dual differential input stage 304a and produces an output voltage at the voltage output (Vout). The compensation network 312a is coupled between the voltage output (Vout) and the output of the dual differential input stage 304a.

In the embodiment of FIG. 3A, Vout=Vin+(Gm2/Gm0)*(Rgnd−Agnd), wherein Gm2 is the transconductance of the transistor Mn2, and Gm0 is the transconductance of the transistor Mp0. If Gm2=Gm0, which can be achieved through appropriate adjustments in device dimensions, then the equation becomes Vout=Vin+Rgnd−Agnd. Further, it is noted that in each of the embodiments described herein, if Vout is being measured with respect to Agnd, then Agnd can be assumed to be zero, and the above equation becomes Vout=Vin+Rgnd. In the embodiment of FIG. 3A, the transistors Mp0 and Mn2 both work in their sub-threshold region. The NMOS and PMOS transistors preferably have identical biasing currents (ID). Additionally, Gm=ID/(n*VT), where Gm0=Gm2. VT is the thermal voltage, which is, e.g., about 26 mV at 27 degree Celsius for bipolar junction transistors, and Gm=IC/VT, where IC is the collector current. For a sub-threshold MOSFET, if ID=IC, then its Gm is less than a bipolar junction transistor's Gm, so a MOSFET's thermal voltage is defined as n*VT, where n is greater than 1 and related to the W/L ratio, where W is the width of MOSFET channel, and L is the channel length. In FIG. 3A, since the PMOS transistors Mp1 and Mp0 are biased using the same bias current, and the PMOS transistors Mp1 and Mp0 are designed to have the same transconductance (i.e., the same Gm), then the source-to-drain currents through the PMOS transistors Mp1 and Mp0 will be the same. If Rgnd and Agnd are the same, then the drain-to-source currents through the NMOS transistors Mn2 and Mn3 will be the same, and Vout will equal Vin. However, if Rgnd and Agnd are different, which is almost always the case, then the drain-to-source currents through the NMOS transistors Mn2 and Mn3 will be different, which will have the effect of causing Vout=Vin+Rgnd−Agnd, or simply Vout=Vin+Rgnd, if Agnd is assumed to be zero.

Figure 3B:
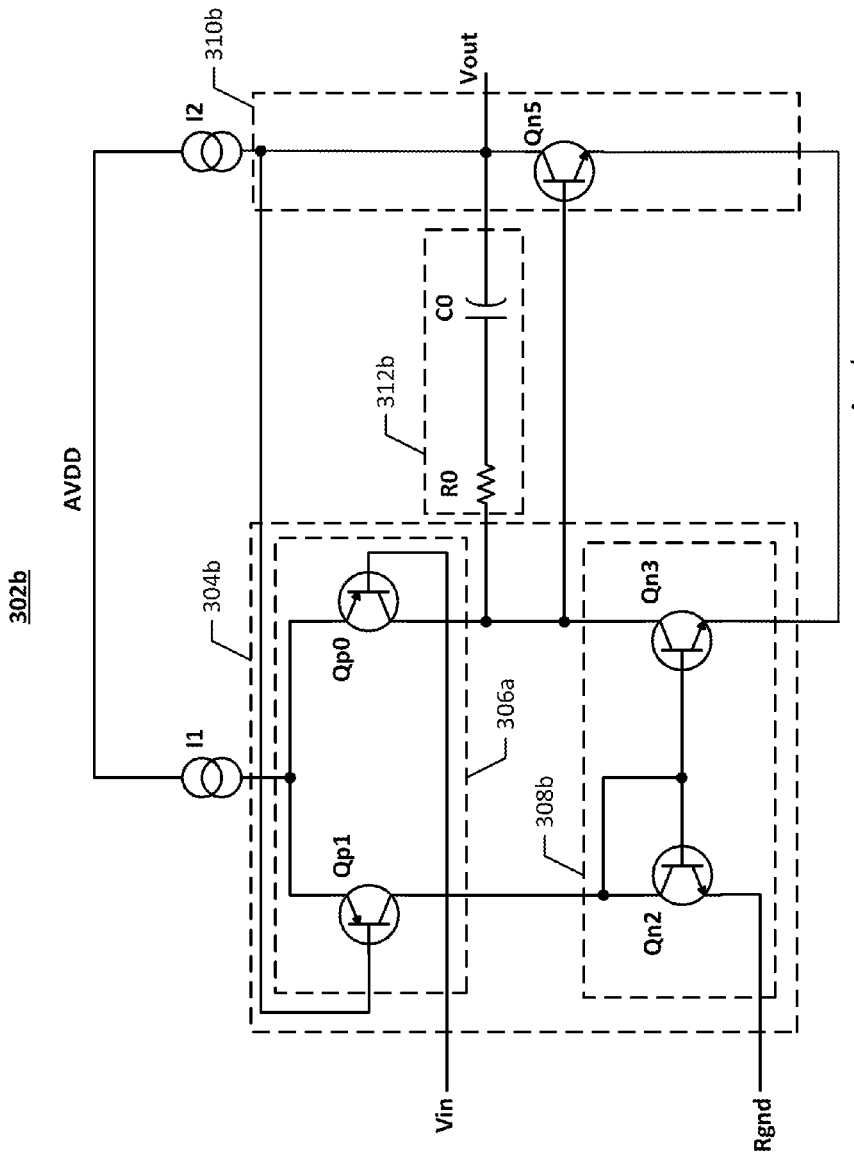
FIG. 3B illustrates a remote differential voltage sensing circuit according to another embodiment of the present invention.

In an alternative embodiment, bipolar junction transistors (BJTs) Qp0, Qp1, Qn2, Qn3 and Qn5 can be used, respectively, in place of the MOSFET transistors Mp0, Mp1, Mn2, Mn3 and Mn5, as shown in FIG. 3B. In the embodiment of FIG. 3B, the transistors Qp0, Qp1, Qn3 and Qn2 form a dual differential input stage 304b that includes a common-emitter differential input stage 306b in parallel with a common-base differential input stage 308b. The common-emitter differential input stage 306b has differential inputs, one of which is coupled to the voltage input (Vin), and the other one of which is coupled to the voltage output (Vout). The common-base differential input stage 308a has differential inputs one of which is coupled to a local ground (Agnd) and the other one of which is coupled to a remote ground (Rgnd). An output of the dual differential input stage 304b is produced at or provided by the connected together collectors of the transistors Qp0 and Qn3. In the embodiment of FIG. 3B, the transistor Qn5 provides an output stage 310b that is driven by an output of the dual differential input stage 304b and produces an output voltage at the voltage output (Vout). A compensation network 312b is coupled between the voltage output (Vout) and the output of the dual differential input stage 304b. As was the case in FIG. 3A, the resistor R0 of the compensation network 312b is optional, and thus, can be removed. If Rgnd and Agnd are the same, then the collector-to-emitter currents through the NPN transistors Qn2 and Qn3 will be the same, and Vout will equal Vin. However, if Rgnd and Agnd are different, which is almost always the case, then the collector-to-emitter currents through the NPN transistors Qn2 and Qn3 will be different, which will have the effect of causing Vout=Vin+(Gm2/Gm0)*(Rgnd−Agnd), wherein Gm2 is the transconductance of the transistor Qn2, and Gm0 is the transconductance of the transistor Qp0. If Gm2=Gm0, which can be achieved through appropriate adjustments in device dimensions, then the equation becomes Vout=Vin+Rgnd−Agnd. Further, if Vout is being measured with respect to Agnd, then Agnd can be assumed to be zero, and the equation becomes Vout=Vin+Rgnd.

Figure 4A:
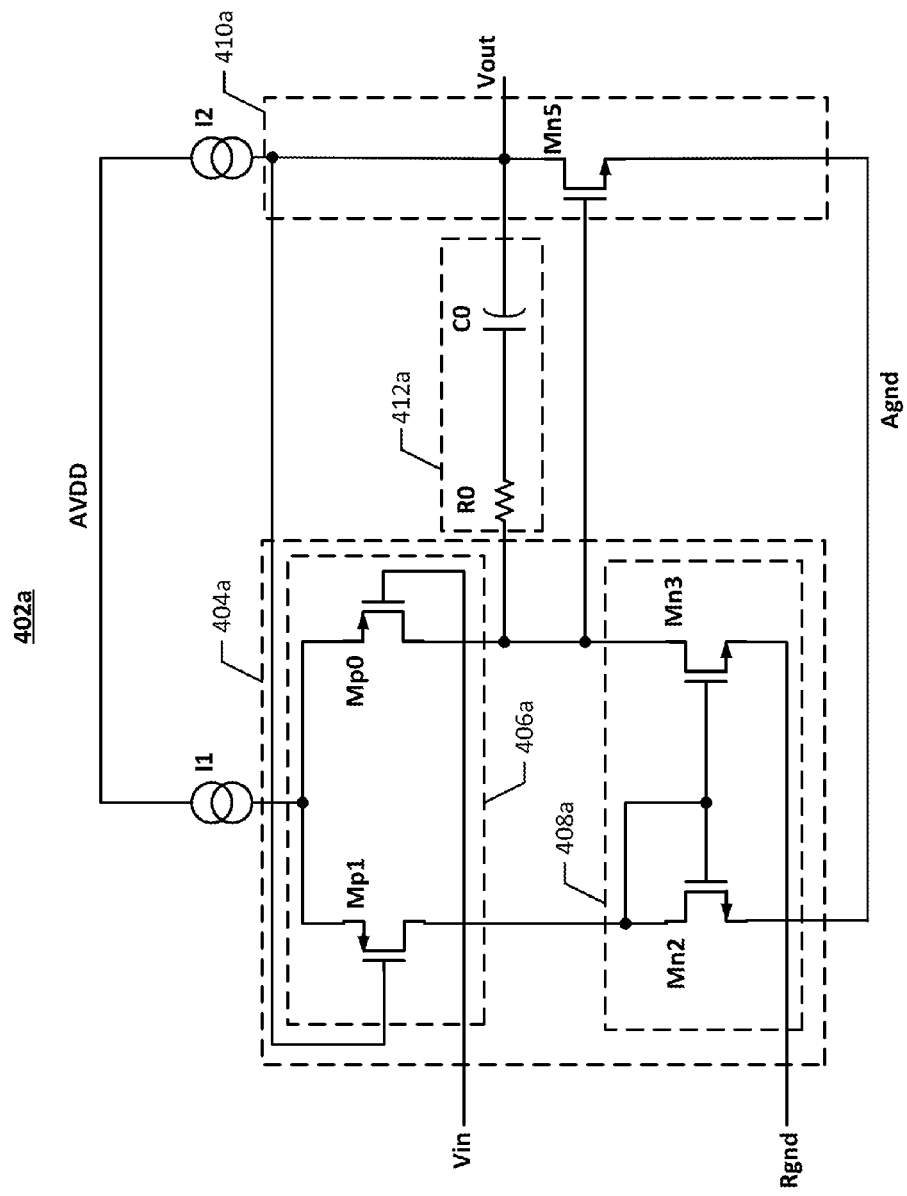
FIG. 4A illustrates a remote differential voltage sensing circuit according to an embodiment of the present invention.

It is also within the scope of embodiments of the present invention to swap the source connections of the NMOS transistors Mn2 and Mn3 in FIG. 3A. More specifically, referring to FIG. 4A, by connecting the source of the transistor Mn2 to Agnd, and the source of the transistor Mn3 to Rgnd, then Vout=Vin−(Gm2/Gm0)*(Rgnd−Agnd), wherein Gm2 is the transconductance of the transistor Mn2, and Gm0 is the transconductance of the transistor Mp0. If Gm2=Gm0, then the equation becomes Vout=Vin−Rgnd+Agnd. Further, if Vout is being measured with respect to Agnd, then Agnd can be assumed to be zero, and the equation becomes Vout=Vin−Rgnd. In FIG. 4A, the transistors Mp0, Mp1, Mn3 and Mn2 form a dual differential input stage 404a that includes a common-source differential input stage 406a in parallel with a common-gate differential input stage 408a. In FIG. 4A, the transistor Mn5 provides an output stage 410a, and a compensation network 412a stabilizes the two stage amplifier of the remote differential voltage sensing circuit 402a.

Figure 4B:
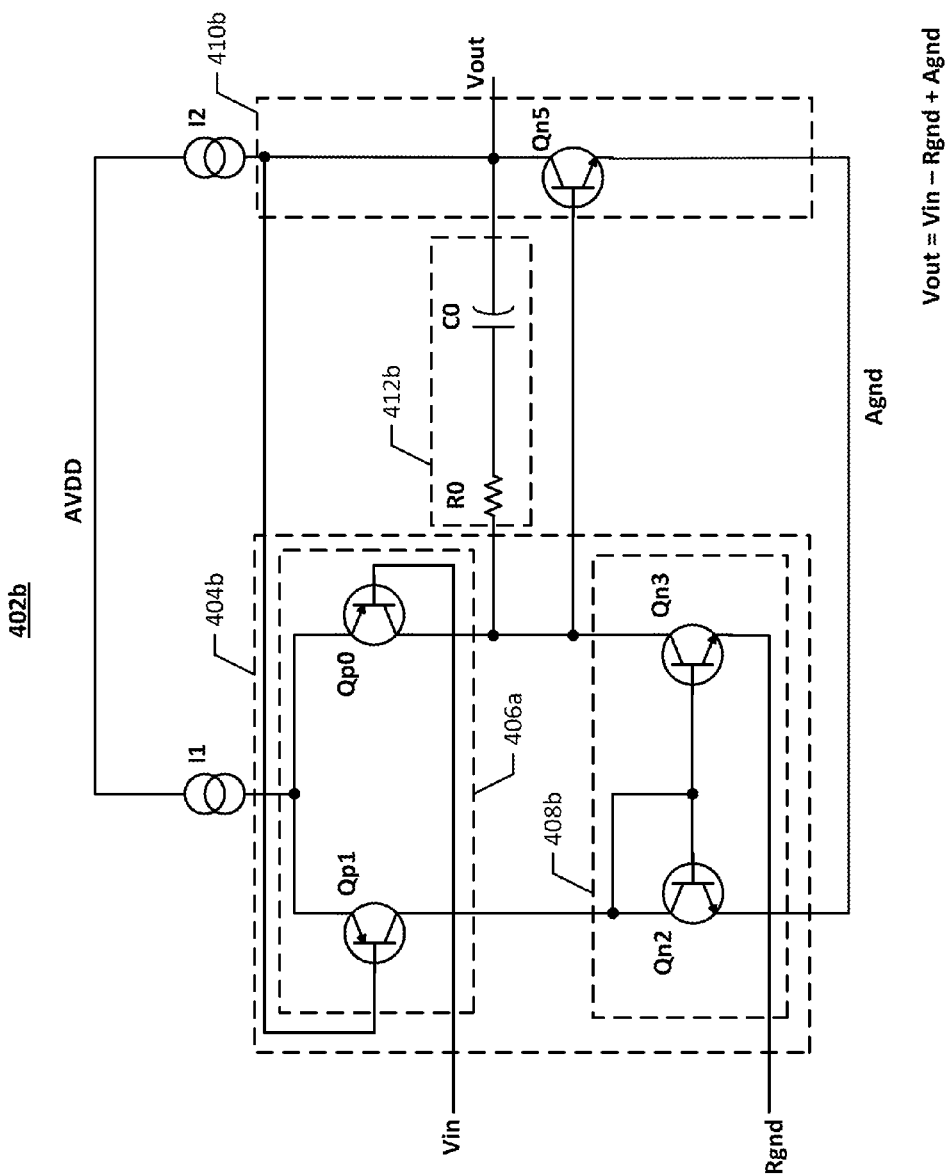
FIG. 4B illustrates a remote differential voltage sensing circuit according to another embodiment of the present invention.

It is also within the scope of an embodiment of the present invention to swap the emitter connections of the NPN transistors Qn2 and Qn3 in FIG. 3B. More specifically, referring to FIG. 4B, by connecting the emitter of the transistor Qn2 to Agnd, and the emitter of the transistor Qn3 to Rgnd, then Vout=Vin−(Gm2/Gm0)*(Rgnd−Agnd), wherein Gm2 is the transconductance of the transistor Qn2, and Gm0 is the transconductance of the transistor Qp0. If Gm2=Gm0, then the equation becomes Vout=Vin−Rgnd+Agnd. Further, if Vout is being measured with respect to Agnd, then Agnd can be assumed to be zero, and the equation becomes Vout=Vin−Rgnd. In FIG. 4B, the transistors Qp0, Qp1, Qn3 and Qn2 form a dual differential input stage 404b that includes a common-emitter differential input stage 406b in parallel with a common-base differential input stage 408b. In FIG. 4B, the transistor Qn5 provides an output stage 410b, and a compensation network 412b stabilizes the two stage amplifier of the remote differential voltage sensing circuit 402b.

The remote differential voltage sensing circuits 302a and 302b of FIGS. 3A and 3B operate as a voltage adder circuits, and thus, can also be referred to as a voltage adder circuits. The remote differential voltage sensing circuits 402a and 402b of FIGS. 4A and 4B operate as a voltage subtractor circuits, and thus, can also be referred to as a voltage subtractor circuits.

In the above described embodiments, a remote differential sensing circuit accepts inputs from a remote ground (Rgnd) and local ground (Agnd) and determines the difference in potential of these two grounds. A difference between Rgnd and Agnd offsets the operation of the differential input stage. If Rgnd is bigger, the current is adjusted between the left and right branch of the circuit and the overall feedback forces the current in the input pair to track this adjustment. For example, in FIG. 3A, when the circuit is operating, the DC current output of a first stage, which is the current through source-to-drain path of the transistor Mn5, will be zero (i.e., balanced) due to feedback. The current output from the first stage is Gmp. The AC current generated by Mp1 and Mp0 is (Vin−Vout)*Gmp. Added to the current output of the first stage is the AC current generated by Mn2 and Mn3, which is (Rgnd−Agnd)*Gmn. These two AC currents added together equals zero. By designing Gmp=Gmn, a desired result is achieved, with the two Gm stages feeding into each other. In other words, two Gm stages that are in parallel are forced to balance out one another. Preferably, the Gms of the top stage and the bottom stage should be substantially equal. Because these transistors share the same current, and because they are operated in their subthreshold operational regions so that the Gms are dependent primarily on the current, then it's relatively easy to get the Gms to be substantially equal. When operating in their subthreshold operating region, the Gm of each transistor is basically equal to current divided by some fixed voltage, which is the same fixed voltage for each of the transistors. This enables the various Gms to be balanced. This configuration makes the matching of the various Gms much easier to obtain than would otherwise be possible. Typically to match two Gms there is usually a need to match the size ratio of the two devices and the current of the two devices. By definition, the currents that go through the P-type devices and the N-type devices are matched. Electron mobility in this configuration is second order, which is beneficial. The choice of width and length of the transistors is selected to enable the transistors to operate in their subthreshold region.

Figure 5A:
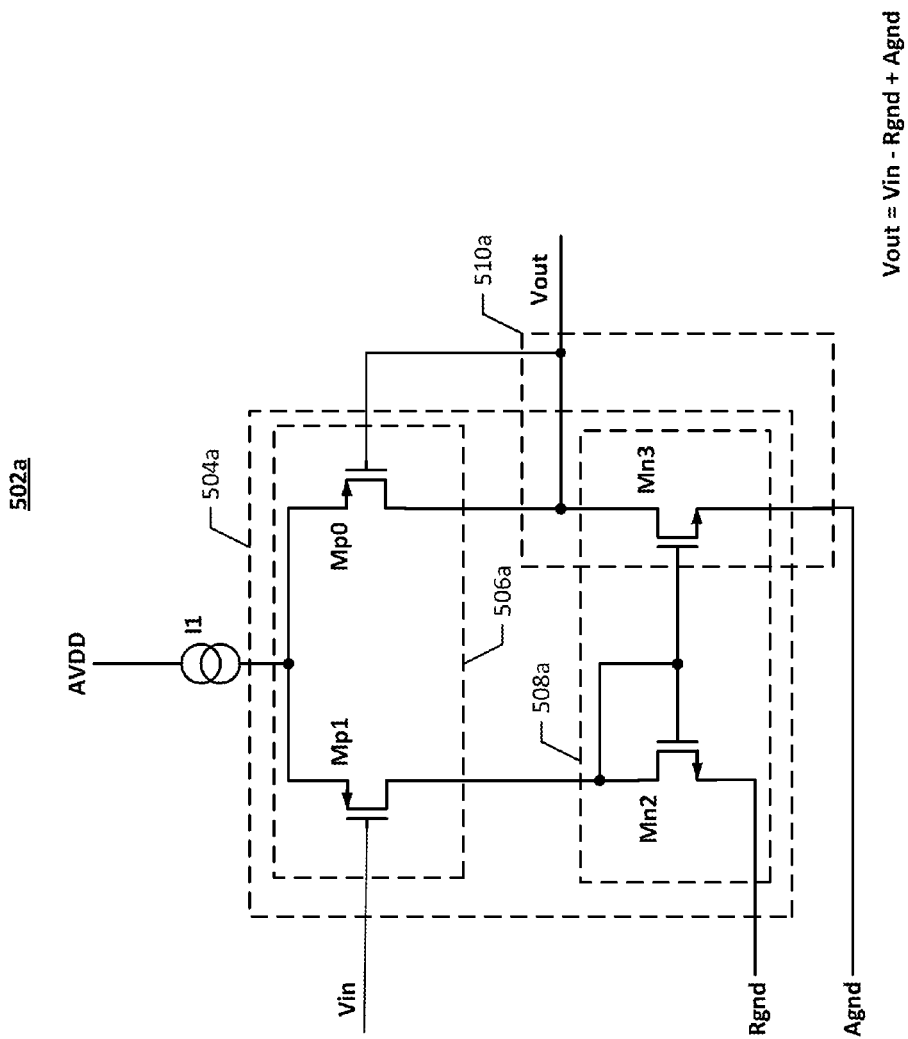
FIG. 5A illustrates a remote differential voltage sensing circuit according to a further embodiment of the present invention.

FIG. 5A illustrates a remote differential voltage sensing circuit 502a according to another embodiment of the present invention. In the embodiment of FIG. 5A, the MOSFET transistors Mp0, Mp1, Mn3 and Mn2 form a dual differential input stage 504a that includes a common-source differential input stage 506a in parallel with a common-gate differential input stage 508a. The common-source differential input stage 506a has differential inputs, one of which is coupled to the voltage input (Vin), and the other one of which is coupled to the voltage output (Vout). The common-gate differential input stage 508a has differential inputs, one of which is coupled to a local ground (Agnd) and the other one of which is coupled to a remote ground (Rgnd). In the embodiment of FIG. 5A, the transistor Mn3 also functions as an output stage 510a for the remote differential voltage sensing circuit 502a. In FIG. 5A, Vout=Vin−Rgnd+Agnd, assuming Gm0=Gm2. If Vout is being measured with respect to Agnd, then Agnd can be assumed to be zero, and the equation becomes Vout=Vin−Rgnd.

Figure 5B:
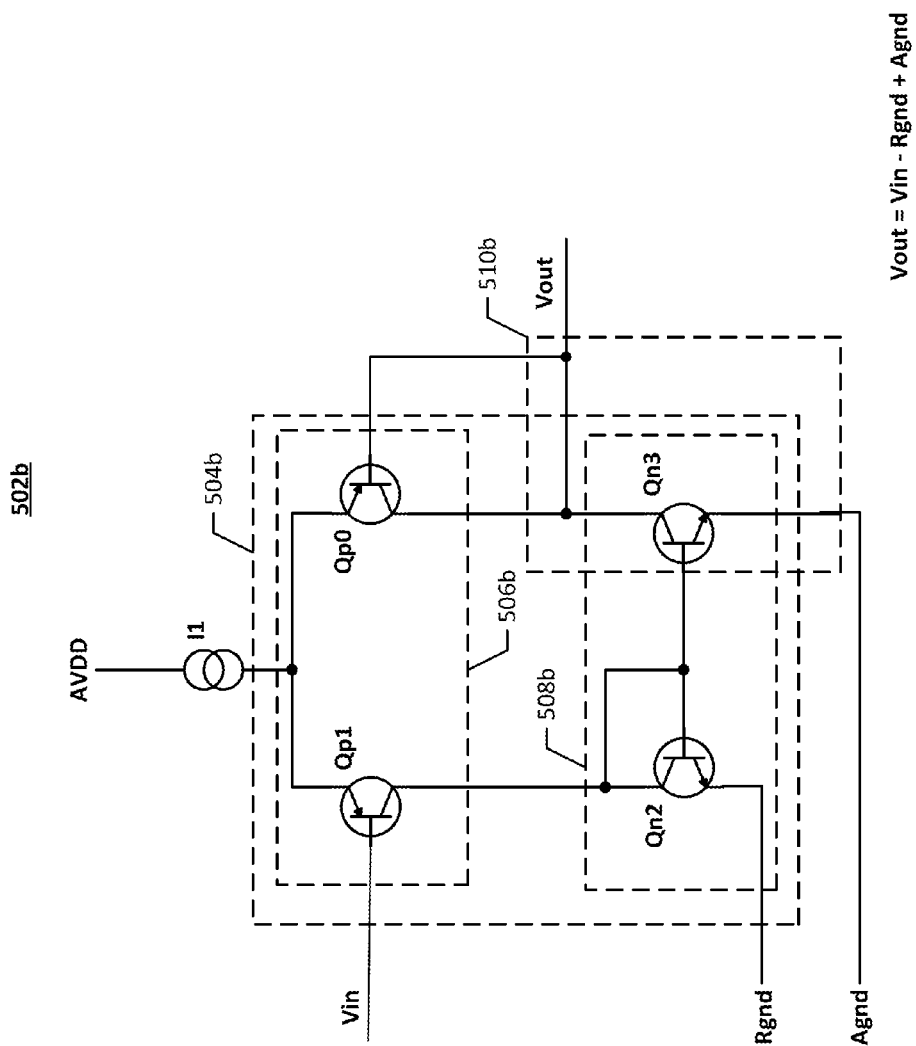
FIG. 5B illustrates a remote differential voltage sensing circuit according to still a further embodiment of the present invention.

FIG. 5B illustrates a remote differential voltage sensing circuit 502b according to another embodiment of the present invention. In the embodiment of FIG. 5B, the BJT transistors Qp0, Qp1, Qn3 and Qn2 form a dual differential input stage 504b that includes a common-emitter differential input stage 506b in parallel with a common-base differential input stage 508b. The common-emitter differential input stage 506b has differential inputs, one of which is coupled to the voltage input (Vin), and the other one of which is coupled to the voltage output (Vout). The common-base differential input stage 508b has differential inputs, one of which is coupled to a local ground (Agnd) and the other one of which is coupled to a remote ground (Rgnd). In the embodiment of FIG. 5B, the transistor Qn3 also functions as an output stage 510b for the remote differential voltage sensing circuit 502b. In FIG. 5B, Vout=Vin−Rgnd+Agnd, assuming Gm0=Gm2. If Vout is being measured with respect to Agnd, then Agnd can be assumed to be zero, and the equation becomes Vout=Vin−Rgnd.

Figure 6A:
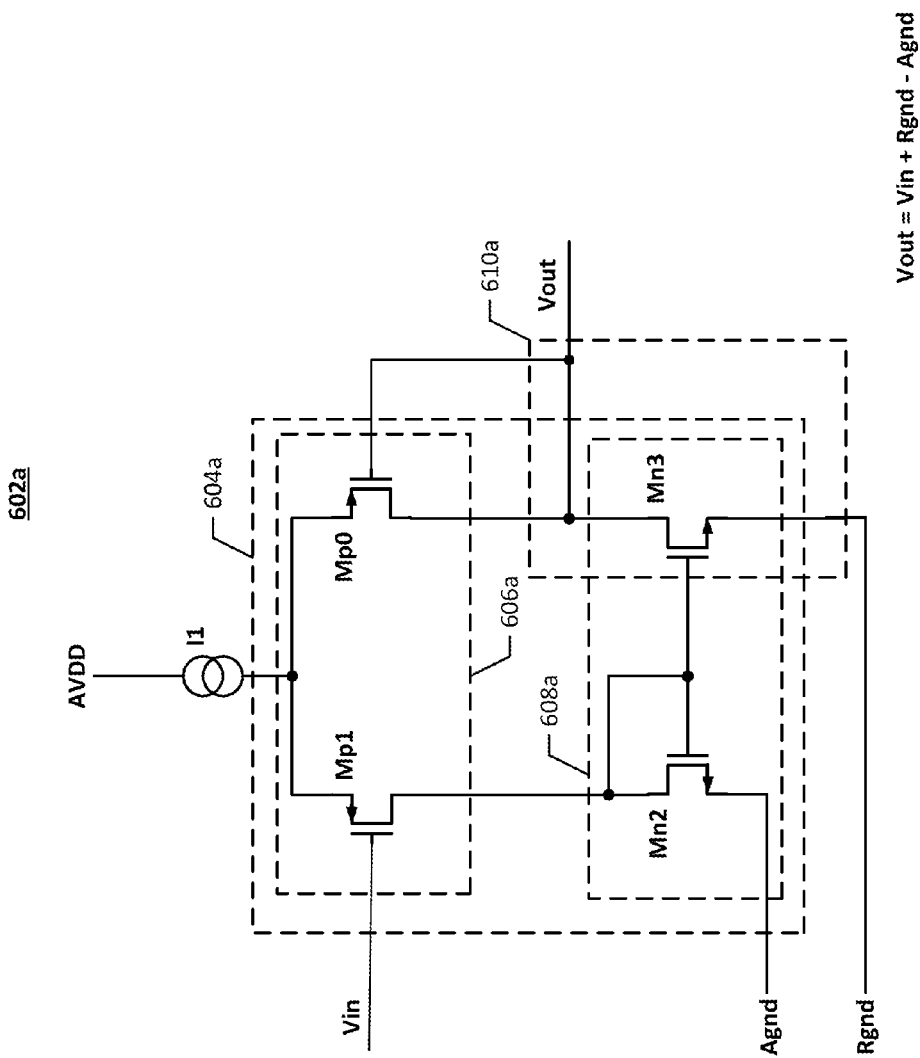
FIG. 6A illustrates a remote differential voltage sensing circuit according to another embodiment of the present invention.

It is also within the scope of embodiments of the present invention to swap the source connections of the NMOS transistors Mn2 and Mn3 in FIG. 5A. More specifically, referring to FIG. 6A, by connecting the source of the transistor Mn2 to Agnd, and the source of the transistor Mn3 to Rgnd, then Vout=Vin+Rgnd−Agnd, assuming Gm0=Gm2. If Vout is being measured with respect to Agnd, then Agnd can be assumed to be zero, and the equation becomes Vout=Vin+Rgnd. In the embodiment of FIG. 6A, the MOSFET transistors Mp0, Mp1, Mn3 and Mn2 form a dual differential input stage 604a that includes a common-source differential input stage 606a in parallel with a common-gate differential input stage 608a. The common-source differential input stage 606a has differential inputs, one of which is coupled to the voltage input (Vin), and the other one of which is coupled to the voltage output (Vout). The common-gate differential input stage 608a has differential inputs, one of which is coupled to a local ground (Agnd) and the other one of which is coupled to a remote ground (Rgnd). In the embodiment of FIG. 6A, the transistor Mn3 also functions as an output stage 610a for the remote differential voltage sensing circuit 602a.

Figure 6B:
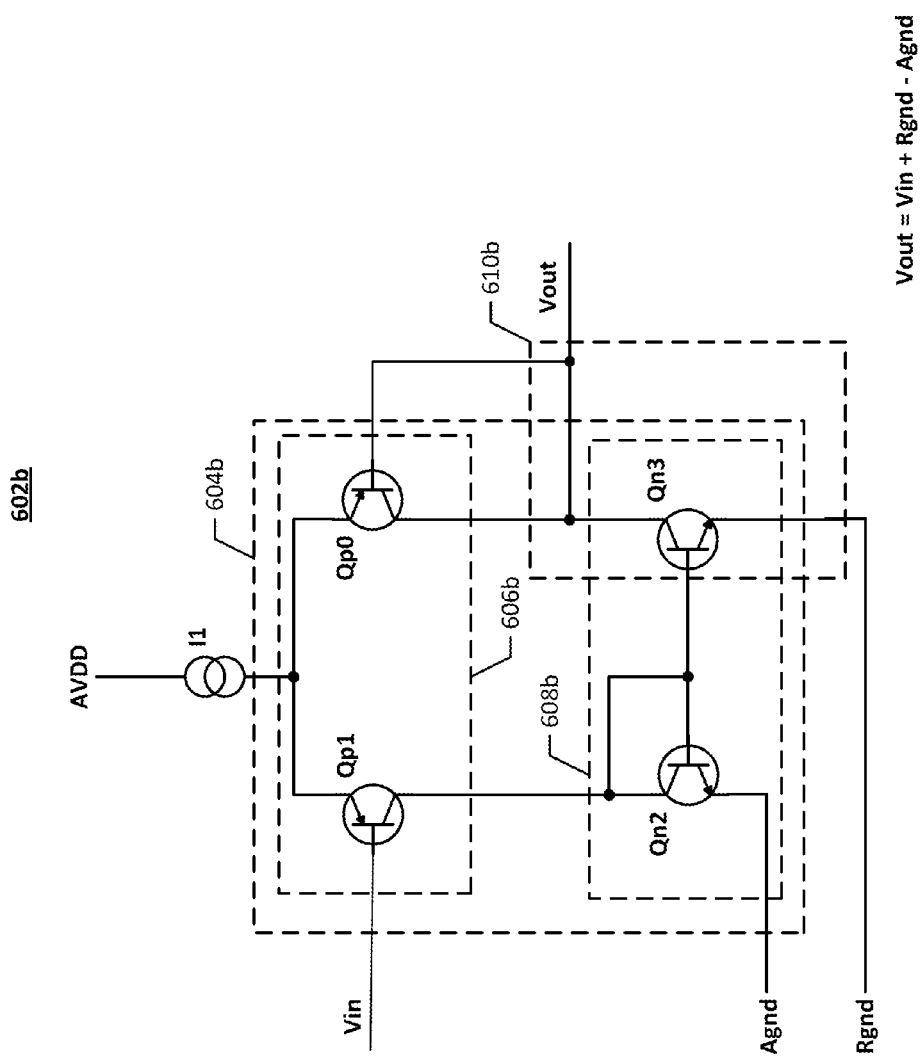
FIG. 6B illustrates a remote differential voltage sensing circuit according to still another embodiment of the present invention.

It is also within the scope of an embodiment of the present invention to swap the emitter connections of the NPN transistors Qn2 and Qn3 in FIG. 5B. More specifically, referring to FIG. 6B, by connecting the emitter of the transistor Qn2 to Agnd, and the emitter of the transistor Qn3 to Rgnd, then Vout=Vin+Rgnd−Agnd, assuming Gm0=Gm2. If Vout is being measured with respect to Agnd, then Agnd can be assumed to be zero, and the equation becomes Vout=Vin+Rgnd. In the embodiment of FIG. 6B, the BJT transistors Qp0, Qp1, Qn3 and Qn2 form a dual differential input stage 604b that includes a common-emitter differential input stage 606b in parallel with a common-base differential input stage 608b. The common-emitter differential input stage 606b has differential inputs, one of which is coupled to the voltage input (Vin), and the other one of which is coupled to the voltage output (Vout). The common-base differential input stage 608b has differential inputs, one of which is coupled to a local ground (Agnd) and the other one of which is coupled to a remote ground (Rgnd). In the embodiment of FIG. 6B, the transistor Qn3 also functions as an output stage 610b for the remote differential voltage sensing circuit 602b.

As used herein, the term "Vin" can be used to both represent the input node of a remote differential voltage sensing circuit, and the voltage at the input node, depending on context. In other words, Vin is used to both refer to the input terminal of a circuit, as well as the voltage at the input terminal. Similarly, the term "Vout" can be used to both represent the output node of a remote differential voltage sensing circuit, and the voltage at the output node, depending on context. In other words, Vout is used to both refer to the output terminal of a circuit, as well as the voltage at the output terminal. Additionally, Agnd can be used to represent the local ground node and the voltage at that node, and Rgnd can be used to represent the remote ground voltage and the voltage at that node. Further, I1 represents both a current source and the current generated by the current source; and I2 represents both a current source and the current generated by the current source. How such terms are being used will be clear from the context in which such terms are used.

The remote differential voltage sensing circuits of FIGS. 4A, 4B, 5A and 5B, which generate Vout=Vin−Rgnd+Agnd, can be used where Vin is an external voltage relative to a chip, and there is a desired to replicate Vin inside the chip. The remote differential voltage sensing circuits of FIGS. 3A, 3B, 6A and 6B, which generate Vout=Vin+Rgnd−Agnd, can be used where Vin is an internal voltage relative to a chip, and there is a desired to replicate Vin outside the chip.

The remote differential voltage sensing circuits described herein sense three inputs, namely Vin, Rgnd and Agnd, and generate an output Vout that equals Vin+Rgnd−Agnd, or Vin−Rgnd+Agnd, depending upon the embodiment. The Rgnd and Agnd inputs will typically have a low impedance and be within tens of mV of one another. In the embodiments described herein, a common-gate (or common-base) differential input stage (e.g., 308a, 308b, 408a, 408b, 508a, 508b, 608a or 608b) senses a difference between Rgnd and Agnd and generates an offset current indicative thereof. The offset current generated by the common-gate (or common-base) differential input stage is used as a load of a common-source (or common-emitter) differential input stage (e.g., 306a, 306b, 406a, 406b, 506a, 506b, 606a or 606b), which senses the input voltage Vin (above ground) and monitors the output voltage Vout (equally above ground). By building the common-gate (or common-base) differential input stage into a feedback amplifier, a difference between the ground potentials Rgnd and Agnd is automatically subtracted from the inputs of the common-source (or common-emitter) differential input stage (e.g., 306a, 306b, 406a, 406b, 506a, 506b, 606a or 606b). Accordingly, the same current is used for sensing the ground potentials Rgnd and Agnd and monitoring the feedback, which provides for current savings. The full arithmetic operation, Vin+Rgnd−Agnd, or Vin−Rgnd+Agnd, is achieved in a ring of four transistors (i.e., Mp0, Mp1, Mn2 and Mn3; or Qp0, Qp1, Qn2 and Qn3) of a dual differential input stage (e.g., 304a, 304b, 404a, 404b, 504a, 504b, 604a or 604b), which provides for maximum speed for a given level of current.

Explained another way, the remote differential voltage sensing circuits described herein senses a voltage difference between a remote ground point (Rgnd) and a local ground (Agnd), and apply this voltage difference between the source (or emitter) terminals of a common-gate (or common-base) differential input stage (e.g., 308a, 308b, 408a, 408b, 508a, 508b, 608a or 608b) in order to generate a current imbalance therein. This current imbalance is applied to a common-source (or common-emitter) differential input stage (e.g., 306a, 306b, 406a, 406b, 506a, 506b, 606a or 606b), so as to disturb a symmetry of the common-source (or common-emitter) differential input stage (e.g., 306a, 306b, 406a, 406b, 506a, 506b, 606a or 606b) and thereby create a voltage offset between inputs (e.g., the gates of Mp0 and Mp1, or bases of Qp0 and Qp1) to the common-source (or common-emitter) differential input stage.

In accordance with certain embodiments, a resistor can be coupled between Rgnd and Agnd to limit the amount of electrostatic discharge (ESD) stress put between the source junctions on transistors Mn2 and Mn3 (or between the emitter junctions on transistors Qn2 and Qn3). In accordance with other embodiments, a series resistor can be coupled between Rgnd and the source of transistor Mn2 (or between Rgnd and the emitter of transistor Qn2), and a further series resistor can be coupled between Agnd and the source of transistor Mn3 (or between Agnd and the emitter of transistor Qn3). Alternatively, any other conventional or nonconventional ESD protection techniques can be used. In accordance with certain embodiments, the body of transistor M2 is tied to its source, and the body of transistor M3 is tied to its source.

Figure 7A:
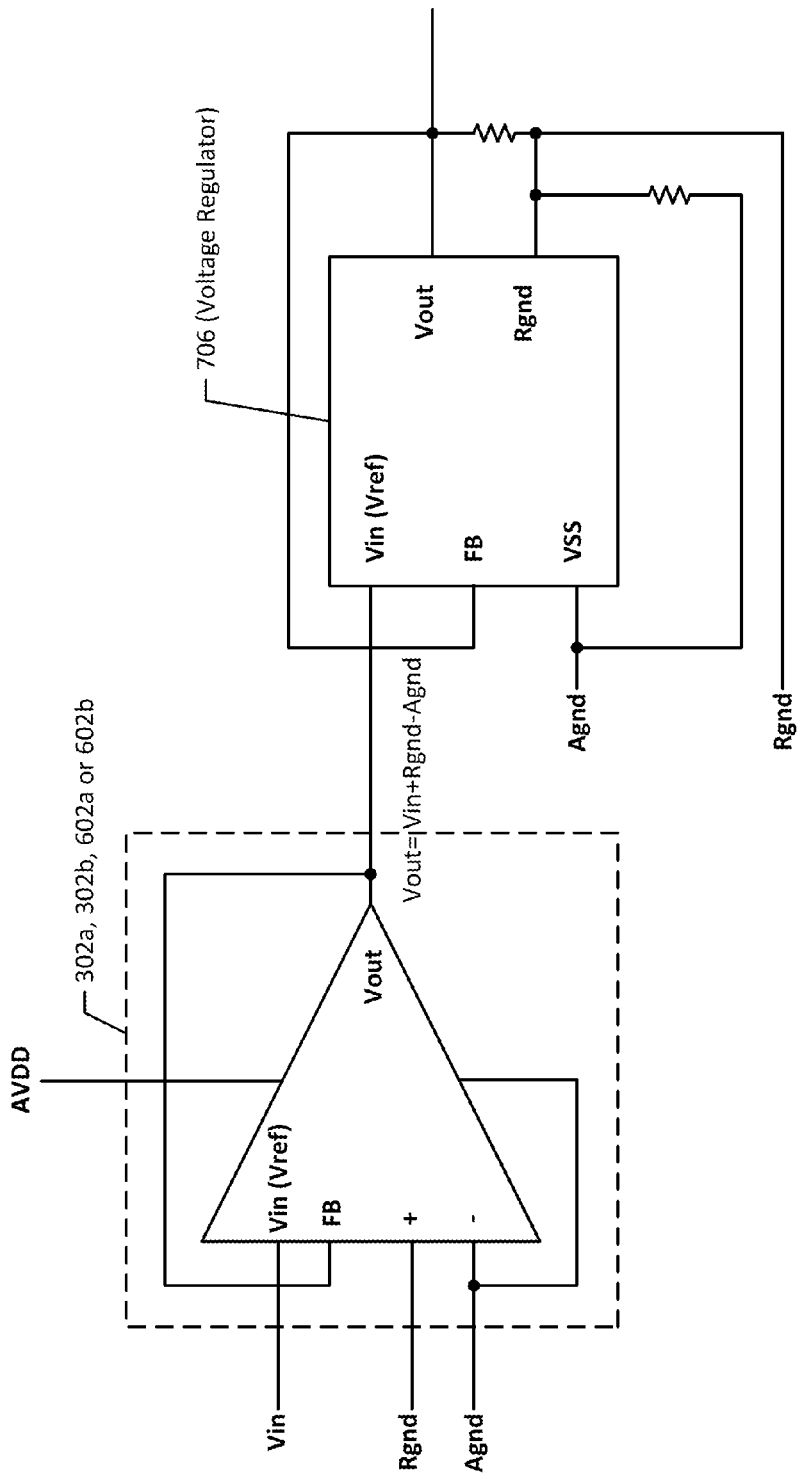
FIG. 7A illustrates a system, according to an embodiment of the present invention, including a voltage regulator having an input terminal that receives the output voltage of one of the remote differential voltage sensing circuits described above with reference to FIGS. 3A, 3B, 6A and 6B.

Certain embodiments of the present invention can be used to provide an input voltage to an input terminal of a voltage regulator. For example, FIG. 7A illustrates a system including a voltage regulator 706 having an input terminal, which can also be referred to as a reference input terminal or simply a reference terminal, that receives the output voltage (Vout) of one of the remote differential voltage sensing circuits 302a, 302b, 602a or 602b, described above with reference to FIGS. 3A, 3B, 6A and 6B. The voltage regulator 706 can be, for example, a DC-DC buck converter, but is not limited thereto.

Figure 7B:
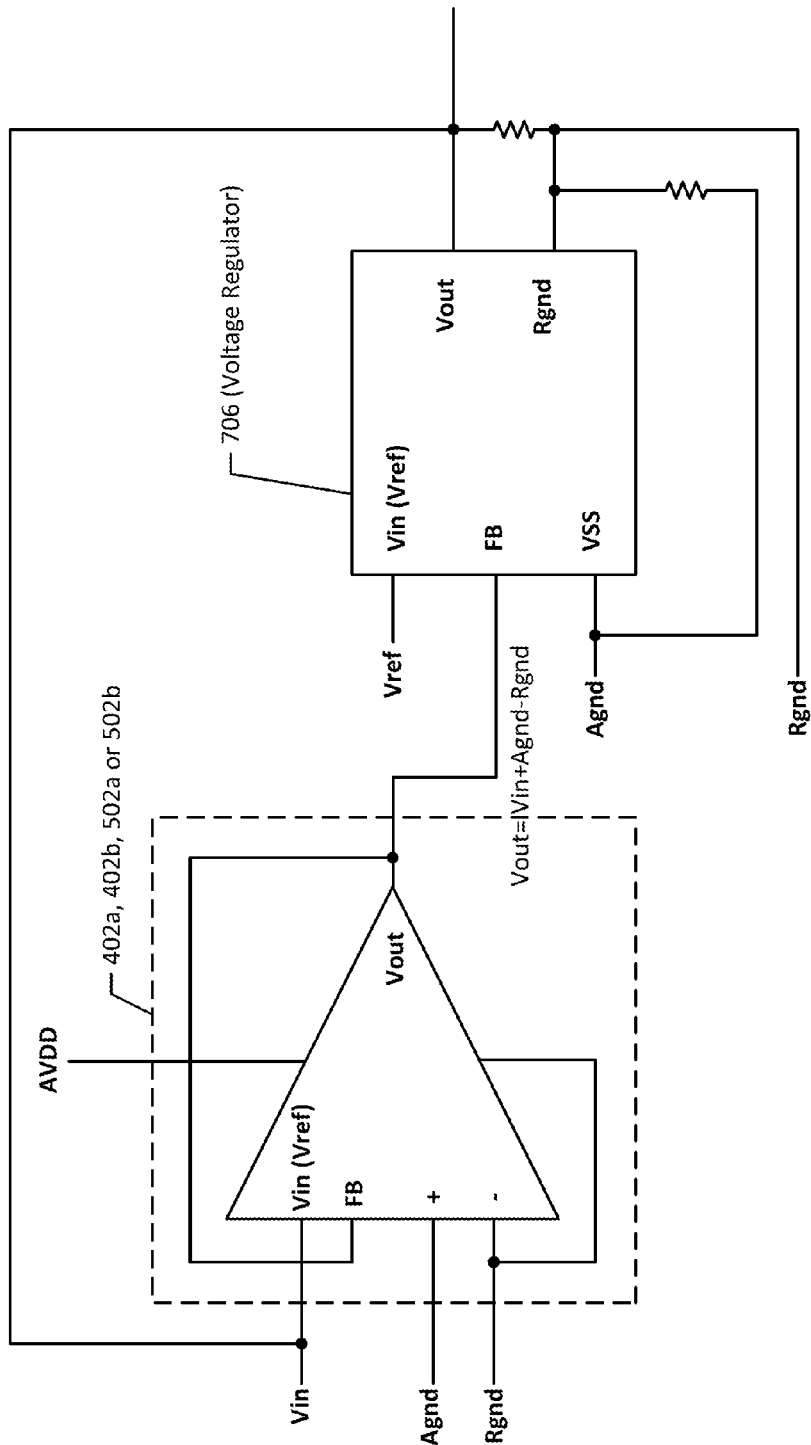
FIG. 7B illustrates a system, according to an embodiment of the present invention, including a voltage regulator having one of the remote differential voltage sensing circuits described above with reference to FIGS. 4A, 4B, 5A and 5B within a feedback path.

Certain embodiments of the present invention can be included in the feedback path of a voltage regulator. For example, FIG. 7B illustrates a system including a voltage regulator 706 having one of the remote differential voltage sensing circuits 402a, 402b, 502a or 502b, described above with reference to FIGS. 4A, 4B, 5A and 5B, within a feedback path between a voltage output (Vout) terminal of the voltage regulator 706 and the feedback terminal (FB) of the voltage regulator 706.

Figure 8:
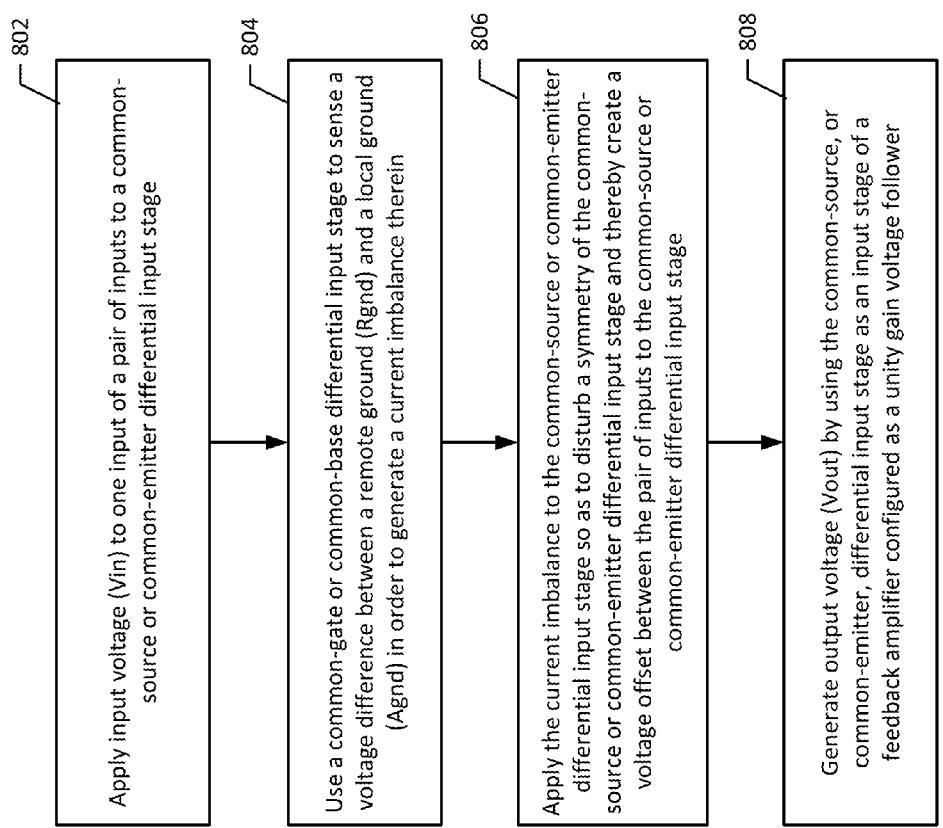
FIG. 8 is a high level flow diagram that is used to summarize methods according to various embodiments of the present invention.

Embodiments of the present invention are also directed to methods for generating an output voltage (Vout) that is equal to an input voltage (Vin) plus or minus a difference between a remote ground (Rgnd) and a local ground (Agnd). Such methods are summarized in the high level flow diagram of FIG. 8. In other words, FIG. 8 is a high level flow diagram that is used to summarize methods according to various embodiments of the present invention. Referring to FIG. 8, step 802 involves applying an input voltage (Vin) to one input of a pair of inputs to a common-source or common-emitter differential input stage (e.g., 306a, 306b, 406a, 406b, 506a, 506b, 606a or 606b). Step 804 involves using a common-gate or common-base differential input stage (e.g., 308a, 308b, 408a, 408b, 508a, 508b, 608a or 608b) to sense a voltage difference between a remote ground (Rgnd) and a local ground (Agnd) in order to generate a current imbalance therein. Step 806 involves applying the current imbalance to the common-source or common-emitter differential input stage (e.g., 306a, 306b, 406a, 406b, 506a, 506b, 606a or 606b) so as to disturb a symmetry of the common-source or common-emitter differential input stage and thereby create a voltage offset between the pair of inputs to the common-source or common-emitter differential input stage. Step 808 involves generating an output voltage (Vout) by using the common-source or common-emitter differential input stage (e.g., 306a, 306b, 406a, 406b, 506a, 506b, 606a or 606b) as an input stage of a feedback amplifier configured as a unity gain voltage follower. Circuits that function as unity gain voltage followers are illustrated in FIGS. 3A, 3B, 4A, 4B, 5A, 5B, 6A and 6B. In other words, the remote differential voltage sensing circuits described herein can operate as unity gain voltage followers.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A remote differential voltage sensing circuit including a voltage input (Vin) and a voltage output (Vout), comprising:
   a dual differential input stage including a common-source or common-collector differential input stage in parallel with a common-gate or common-base differential input stage;
   wherein the common-source or common-collector differential input stage has differential inputs one of which is coupled to the voltage input (Vin) and the other one of which is coupled to the voltage output (Vout); and
   wherein the common-gate or common-base differential input stage has differential inputs one of which is coupled to a local ground (Agnd) having a ground potential associated with a die or chip and the other one of which is coupled to a remote ground (Rgnd) having a ground potential associated with a board to which the die or chip is attached such that Vout=Vin+Rgnd−Agnd, or such that Vout=Vin−Rgnd+Agnd.

2. The remote differential voltage sensing circuit of claim 1, further comprising:
   an output stage that is driven by an output of the dual differential input stage and produces an output voltage at the voltage output (Vout).

3. The remote differential voltage sensing circuit of claim 2, further comprising:
   a compensation network coupled between the voltage output (Vout) and the output of the dual differential input stage.

4. The remote differential voltage sensing circuit of claim 3, wherein the compensation network includes a capacitor and resistor connected in series between the voltage output (Vout) and the output of the dual differential input stage.

5. The remote differential voltage sensing circuit of claim 2, further comprising:
   a first current source that biases the dual differential input stage; and
   a second current source that biases the output stage.

6. The remote differential voltage sensing circuit of claim 1, wherein the differential inputs of the common-gate or base differential input stage are coupled to the local ground (Agnd) and the remote ground (Rgnd) such that Vout=Vin+Rgnd−Agnd.

7. The remote differential voltage sensing circuit of claim 1, wherein the differential inputs of the common-gate or base differential input stage are coupled to the local ground (Agnd) and the remote ground (Rgnd) such that Vout=Vin−Rgnd+Agnd.

8. A remote differential voltage sensing circuit including a voltage input (Vin) and a voltage output (Vout), comprising:
   a first transistor (Mp0 or Qp0) having a control terminal (gate or base) and a current path including a first current path terminal (drain or collector) and a second current path terminal (source or emitter), the control terminal (gate or base) of the a first transistor (Mp0 or Qp0) coupled to the voltage input (Vin);
   a second transistor (Mp1 or Qp1) having a control terminal (gate or base) and a current path including a first current path terminal (drain or collector) and a second current path terminal (source or emitter), the control terminal (gate or base) of the second transistor (Mp1 or Qp1) coupled to the voltage output (Vout), and the second current path terminal (source or emitter) of the second transistor (Mp1 or Qp1) coupled to the second current path terminal (source or emitter) of the first transistor (Mp0 or Qp0);
   a third transistor (Mn3 or Qn3) having a control terminal (gate or base) and a current path including a first current path terminal (drain or collector) and a second current path terminal (source or emitter), the first current path terminal (drain or collector) of the third transistor (Mn3 or Qn3) coupled to the first current path terminal (drain or collector) of the first transistor (Mp0 or Qp0), and the second current path terminal (source or emitter) of the third transistor (Mn3 or Qn3) coupled to a local ground (Agnd);
   a fourth transistor (Mn2 or Qn2) having a control terminal (gate or base) and a current path including a first current path terminal (drain or collector) and a second current path terminal (source or emitter), the control terminal (gate or base) and the first current path terminal (drain or collector) of the fourth transistor (Mn2 or Qn2) coupled together and to the first current path terminal (drain or collector) of the second transistor (Mp1 or Qp1), and the second current path terminal (source or emitter) of the fourth transistor (Mn2 or Qn2) coupled to a remote ground (Rgnd), the control terminal (gate or base) of the fourth transistor (Mn2 or Qn2) also coupled to the control terminal (gate or base) of the third transistor (Mn3 or Qn3);
   a fifth transistor (Mn5 or Qn5) having a control terminal (gate or base) and a current path including a first current path terminal (drain or collector) and a second current path terminal (source or emitter), the control terminal (gate or base) of the fifth transistor (Mn5 or Qn5) coupled to the coupled together first current path terminals (drains or collectors) of the first transistor (Mp0 or Qp0) and the third transistor (Mn3 or Qn3), the first current path terminal (drain or collector) of the fifth transistor (Mn5 or Qn5) coupled to the voltage output (Vout), and the second current path terminal (source or emitter) of the fifth transistor (Mn5 or Qn5) coupled to the local ground (Agnd); and
   a compensation network coupled between the voltage output (Vout) and the control terminal (gate or base) of the fifth transistor (Mn5 or Qn5);
   wherein
   the first and second transistors ((Mp0 or Qp0) and (Mp1 or Qp1)) are PMOS transistors, and the third, fourth and fifth transistors ((Mn3 or Qn3), (Mn2 or Qn2) and (Mn5 or Qn5)) are NMOS transistors; or
   the first and second transistors ((Mp0 or Qp0) and (Mp1 or Qp1)) are PNP transistors, and the third, fourth and fifth transistors ((Mn3 or Qn3), (Mn2 or Qn2) and (Mn5 or Qn5)) are NPN transistors.

9. The remote differential voltage sensing circuit of claim 8, wherein Vout=Vin+(Gm2/Gm0)*(Rgnd−Agnd), wherein Gm0 comprises a transconductance of the first transistor (Mp0 or Qp0) and Gm2 comprises a transconductance of the fourth transistor (Mn2 or Qn2).

10. The remote differential voltage sensing circuit of claim 8, further comprising:
   a first current source (I1) coupled between a high voltage rail (AVDD) and the coupled together second current path terminals (sources or emitters) of the first transistor (Mp0 or Qp0) and the second transistor (Mp1 or Qp1); and
   second current source (I2) coupled between the high voltage rail (AVDD) and the voltage output (Vout).

11. The remote differential voltage sensing circuit of claim 10, wherein the compensation network, which is coupled between the voltage output (Vout) and the control terminal (gate or base) of the fifth transistor (Mn5 or Qn5), includes a capacitor (C0) coupled between the voltage output (Vout) and the control terminal (gate or base) of the fifth transistor (Mn5 or Qn5).

12. The remote differential voltage sensing circuit of claim 11, wherein the compensation network, which is coupled between the voltage output (Vout) and the control terminal (gate or base) of the fifth transistor (Mn5 or Qn5), includes a resistor (R0) coupled in series with the capacitor (C0) between the voltage output (Vout) and the control terminal (gate or base) of the fifth transistor (Mn5 or Qn5).

13. A remote differential voltage sensing circuit including a voltage input (Vin) and a voltage output (Vout), comprising:
   a first transistor (Mp0 or Qp0) having a control terminal (gate or base) and a current path including a first current path terminal (drain or collector) and a second current path terminal (source or emitter), the control terminal (gate or base) of the a first transistor (Mp0 or Qp0) coupled to the voltage input (Vin);
   a second transistor (Mp1 or Qp1) having a control terminal (gate or base) and a current path including a first current path terminal (drain or collector) and a second current path terminal (source or emitter), the control terminal (gate or base) of the second transistor (Mp1 or Qp1) coupled to the voltage output (Vout), and the second current path terminal (source or emitter) of the second transistor (Mp1 or Qp1) coupled to the second current path terminal (source or emitter) of the first transistor (Mp0 or Qp0);
   a third transistor (Mn3 or Qn3) having a control terminal (gate or base) and a current path including a first current path terminal (drain or collector) and a second current path terminal (source or emitter), the first current path terminal (drain or collector) of the third transistor (Mn3 or Qn3) coupled to the first current path terminal (drain or collector) of the first transistor (Mp0 or Qp0), and the second current path terminal (source or emitter) of the third transistor (Mn3 or Qn3) coupled to a remote ground (Rgnd);
   a fourth transistor (Mn2 or Qn2) having a control terminal (gate or base) and a current path including a first current path terminal (drain or collector) and a second current path terminal (source or emitter), the control terminal (gate or base) and the first current path terminal (drain or collector) of the fourth transistor (Mn2 or Qn2) coupled together and to the first current path terminal (drain or collector) of the second transistor (Mp1 or Qp1), and the second current path terminal (source or emitter) of the fourth transistor (Mn2 or Qn2) coupled to a local ground (Rgnd), the control terminal (gate or base) of the fourth transistor (Mn2 or Qn2) also coupled to the control terminal (gate or base) of the third transistor (Mn3 or Qn3);
   a fifth transistor (Mn5 or Qn5) having a control terminal (gate or base) and a current path including a first current path terminal (drain or collector) and a second current path terminal (source or emitter), the control terminal (gate or base) of the fifth transistor (Mn5 or Qn5) coupled to the coupled together first current path terminals (drains or collectors) of the first transistor (Mp0 or Qp0) and the third transistor (Mn3 or Qn3), the first current path terminal (drain or collector) of the fifth transistor (Mn5 or Qn5) coupled to the voltage output (Vout), and the second current path terminal (source or emitter) of the fifth transistor (Mn5 or Qn5) coupled to the local ground (Agnd); and
   a compensation network coupled between the voltage output (Vout) and the control terminal (gate or base) of the fifth transistor (Mn5 or Qn5);
   wherein
   the first and second transistors ((Mp0 or Qp0) and (Mp1 or Qp1)) are PMOS transistors, and the third, fourth and fifth transistors ((Mn3 or Qn3), (Mn2 or Qn2) and (Mn5 or Qn5)) are NMOS transistors; or
   the first and second transistors ((Mp0 or Qp0) and (Mp1 or Qp1)) are PNP transistors, and the third, fourth and fifth transistors ((Mn3 or Qn3), (Mn2 or Qn2) and (Mn5 or Qn5)) are NPN transistors.

14. The remote differential voltage sensing circuit of claim 13, wherein Vout=Vin−(Gm2/Gm0)*(Rgnd−Agnd), wherein Gm0 comprises a transconductance of the first transistor (Mp0 or Qp0) and Gm2 comprises a transconductance of the fourth transistor (Mn2 or Qn2).

15. The remote differential voltage sensing circuit of claim 13, further comprising:
   a first current source (I1) coupled between a high voltage rail (AVDD) and the coupled together second current path terminals (sources or emitters) of the first transistor (Mp0 or Qp0) and the second transistor (Mp1 or Qp1); and
   second current source (I2) coupled between the high voltage rail (AVDD) and the voltage output (Vout).

16. The remote differential voltage sensing circuit of claim 15, wherein the compensation network, which is coupled between the voltage output (Vout) and the control terminal (gate or base) of the fifth transistor (Mn5 or Qn5), includes a capacitor (C0) coupled between the voltage output (Vout) and the control terminal (gate or base) of the fifth transistor (Mn5 or Qn5).

17. The remote differential voltage sensing circuit of claim 16, wherein the compensation network, which is coupled between the voltage output (Vout) and the control terminal (gate or base) of the fifth transistor (Mn5 or Qn5), includes a resistor (R0) coupled in series with the capacitor (C0) between the voltage output (Vout) and the control terminal (gate or base) of the fifth transistor (Mn5 or Qn5).

18. A system comprising:
   a voltage regulator including an reference terminal, an output terminal, a feedback terminal, a local ground terminal coupled to a local ground (Agnd) having a ground potential associated with a die or chip, and a remote ground terminal coupled to a remote ground (Rgnd) having a ground potential associated with a board to which the die or chip is attached;

a remote differential voltage sensing circuit that either provides a voltage to the reference terminal of the voltage regulator, or is connected within a feedback path between the output terminal and the feedback terminal of the voltage regulator;

wherein the remote differential voltage sensing circuit comprises a dual differential input stage including a common-source or common-collector differential input stage in parallel with a common-gate or common-base differential input stage;

wherein the common-source or common-collector differential input stage has differential inputs one of which is coupled to a voltage input (Vin) of the remote differential voltage sensing circuit, and the other one of which is coupled to a voltage output (Vout) of the remote differential voltage sensing circuit; and wherein the common-gate or common-base differential input stage has differential inputs one of which is coupled to the local ground (Agnd) and the other one of which is coupled to the remote ground (Rgnd) such that Vout=Vin+Rgnd−Agnd, or such that Vout=Vin−Rgnd+Agnd.

19. The system of claim 18, wherein the remote differential voltage sensing circuit includes an output stage that is driven by an output of the dual differential input stage.

20. The remote differential voltage sensing circuit of claim 12, further comprising:
a compensation network coupled between the voltage output of the remote differential voltage sensing circuit and the output of the dual differential input stage.

21. A method for generating an output voltage (Vout) that is equal to an input voltage (Vin) plus or minus a difference between a remote ground (Rgnd) and a local ground (Agnd), the method comprising:
(a) applying the input voltage (Vin) to one input of a pair of inputs to a common-source or common-emitter differential input stage;
(b) using a common-gate or common-base differential input stage to sense a voltage difference between the remote ground (Rgnd) and the local ground (Agnd) in order to generate a current imbalance therein;
(c) applying the current imbalance to the common-source or common-emitter differential input stage so as to disturb a symmetry of the common-source or common-emitter differential input stage and thereby create a voltage offset between the pair of inputs to the common-source or common-emitter differential input stage; and
(d) generating the output voltage (Vout) by using the common-source or common-emitter differential input stage as an input stage of a feedback amplifier configured as a unity gain voltage follower.

22. The system of claim 18, wherein:
the remote differential voltage sensing circuit provides a voltage to the reference terminal of the voltage regulator;
the differential inputs of the common-gate or base differential input stage are coupled to the local ground (Agnd) and the remote ground (Rgnd) such that Vout=Vin+Rgnd−Agnd; and
the voltage that the remote differential voltage sensing circuit provides to the reference terminal of the voltage regulator is the voltage output (Vout) of the remote differential voltage sensing circuit.

23. The system of claim 18, wherein:
the remote differential voltage sensing circuit is connected within a feedback path between the output terminal and the feedback terminal of the voltage regulator;
the differential inputs of the common-gate or base differential input stage are coupled to the local ground (Agnd) and the remote ground (Rgnd) such that Vout=Vin−Rgnd+Agnd; and
the voltage output (Vout) of the remote differential voltage sensing circuit is provided to feedback terminal of the voltage regulator.

24. The remote differential voltage sensing circuit of claim 9, wherein Gm2=Gm0, and thus, Vout=Vin+Rgnd−Agnd.

25. The remote differential voltage sensing circuit of claim 14, wherein Gm2=Gm0, and thus, Vout=Vin−Rgnd+Agnd.

* * * * *